United States Patent
Taurasi

(10) Patent No.: US 11,044,821 B2
(45) Date of Patent: Jun. 22, 2021

(54) CLOSURE LATCH ASSEMBLY HAVING AN ENCLOSURE ASSEMBLY FOR ELECTRONIC CONTROLLER TO PROTECT ELECTRONIC COMPONENTS

(71) Applicant: Magna Closures Inc., Newmarket (CA)

(72) Inventor: Marco Taurasi, Leghorn (IT)

(73) Assignee: MAGNA CLOSURES, INC., Newmarket (CA)

( * ) Notice: Subject to any disclaimer, the term of this patent is extended or adjusted under 35 U.S.C. 154(b) by 0 days.

(21) Appl. No.: 16/779,961

(22) Filed: Feb. 3, 2020

(65) Prior Publication Data

US 2020/0178405 A1 Jun. 4, 2020

Related U.S. Application Data

(63) Continuation of application No. 15/426,109, filed on Feb. 17, 2017, now Pat. No. 10,555,425.

(60) Provisional application No. 62/296,634, filed on Feb. 18, 2016.

(51) Int. Cl.
| | |
|---|---|
| H05K 7/00 | (2006.01) |
| H05K 5/00 | (2006.01) |
| B60R 16/02 | (2006.01) |
| H05K 5/02 | (2006.01) |

(52) U.S. Cl.
CPC ........... *H05K 5/0017* (2013.01); *B60R 16/02* (2013.01); *H05K 5/0004* (2013.01); *H05K 5/0056* (2013.01); *H05K 5/0217* (2013.01)

(58) Field of Classification Search
USPC ........................................................ 361/728
See application file for complete search history.

(56) References Cited

U.S. PATENT DOCUMENTS

| | | | |
|---|---|---|---|
| 6,549,423 B1 | 4/2003 | Brodnick | |
| 8,427,836 B2 | 4/2013 | Frank | |
| 10,141,247 B2 | 11/2018 | Walter | |
| 2008/0087571 A1 | 4/2008 | Sasaki | |
| 2015/0252591 A1* | 9/2015 | Roatis | E05B 47/063 70/277 |
| 2015/0361694 A1 | 12/2015 | Zeabari | |
| 2016/0230426 A1* | 8/2016 | Taurasi | E05B 81/06 |
| 2017/0089103 A1* | 3/2017 | Ottino | E05B 81/06 |

FOREIGN PATENT DOCUMENTS

| | | | | |
|---|---|---|---|---|
| CN | 2248443 Y | 2/1997 | | |
| CN | 2298128 Y | 11/1998 | | |
| WO | WO2015044323 | * | 4/2015 | ............. E05B 77/34 |

* cited by examiner

*Primary Examiner* — Hung S. Bui

(74) *Attorney, Agent, or Firm* — Dickinson Wright PLLC

(57) ABSTRACT

An enclosure assembly for enclosing an electronic controller. The enclosure assembly comprises a housing having a plurality of cavities formed therein for receiving electrical components of the electrical controller. The enclosure assembly further includes an over-molded part formed from an elastic material that lines at least a portion of each cavity. The over-molded part reduces the effect of deceleration forces on the electrical component that is received in the cavity thereby protecting it from damage. The over-molded part includes a retention feature that locates the over-molded part within the cavity and secures it to the enclosure assembly. An interference fit is provided between the over-molded part and the electrical component received in the cavity.

20 Claims, 8 Drawing Sheets

CLOSURE LATCH ASSEMBLY HAVING AN ENCLOSURE ASSEMBLY FOR ELECTRONIC CONTROLLER TO PROTECT ELECTRONIC COMPONENTS

CROSS-REFERENCES TO RELATED APPLICATIONS

The present patent application is a Continuation of U.S. Non-provisional patent application Ser. No. 15/426,109, filed Feb. 7, 2017, which claims the benefit of U.S. Provisional Patent Application Ser. No. 62/296,634 filed Feb. 18, 2016. The present patent application incorporates all of the subject matter of these patent applications, herein, by reference, in their entirety.

FIELD

This invention relates generally to an enclosure assembly for an electronic controller and more particularly to an enclosure assembly having an over-molded part to provide enhanced protection of sensitive electronic components received in the enclosure assembly.

BACKGROUND

This section provides background information related to the present disclosure which is not necessarily prior art.

Continued increases in technology permit more and more features to be added to modern vehicles, particularly electronic components and electronic controllers. The electronic controllers receive, process and transmit a variety of electrical data. These electronic controllers and their associated electronic components are used to control a wide variety of functions in the vehicle including common examples such as power windows, power latches for doors and other vehicle panels, motion sensitive locking mechanisms, remote sensing features, garage door openers, touch sensitive combination locks for doors, moon roof controls, seating controls, audio controls, motion sensors, position sensors, and crash sensors. Many times it is most advantageous to have the electronic controllers associated close to the actual mechanisms they control. Thus, for example, one designs an electronic controller for a door latch to be built into the door panel right next to the mechanical locking feature it controls. Typically these electronic controllers include a circuit board, which may be a printed circuit board, to control the mechanical features based on the circuits and electrical components on the board. These circuit boards and electronic controllers are sensitive to environmental damage so they need to be covered and protected from the elements. This is typically done by enclosing them within an enclosure assembly having a housing, often formed from a hard plastic material, and it may include O-ring type seals to prevent ingress of dirt and moisture. Generally the housing is large enough to accommodate the electrical controllers and electrical components with room to spare so that assembly of the entire enclosure assembly can be rapidly accomplished on an assembly line. The enclosure assembly with the electronic controller in it is then mounted to a location on or inside the vehicle. For example, an electronic controller for a latch mechanism might be mounted inside a door of a vehicle and secured to an interior door panel.

One issue with current enclosure assemblies, especially those used to control latches of vehicle panels and doors, is that with use of the door the electrical controller, electrical components and circuit board are subjected to deceleration forces as the door reaches the end of its travel both when it is opened and when it is shut. The door is accelerated from an open position to a closed position or vice versa and then the motion is abruptly stopped as the door reaches its final opened or closed position. These deceleration forces can be significant. As the mass of the part increases the force it is subjected to increases. Many latches are "smart latches" meaning a portion of their action is automatic. So for example many door latches are designed to automatically lock when a vehicle reaches a pre-determined velocity. One feature that is needed for many of these electronic controllers, especially those used in "smart" environments, is the ability to provide power to the circuit board in the event of loss of power from the vehicle battery such as in an accident, interruption of the electrical connection from the battery, or the event of a dead battery. To deal with this issue designers are mounting capacitors, super capacitors and backup batteries onto the circuit board to provide power to the electronic controller in the event of a loss of power from the vehicle battery. These backup power devices are much larger than most other components typically found on the circuit board and thus they are also subjected to higher forces during deceleration events in opening and closing of the door. The deceleration forces can cause the electrical components to be jarred while on the circuit board, they can be damaged internally, and they can detach from the circuit board. These components need to be protected from these deceleration forces. In addition, some enclosure assemblies do not hold the circuit board tightly and as a result, the circuit board rattles in the enclosure assembly during operation of the vehicle, thereby generating noise, which can negatively affect the impression of quality of the vehicle to its owner. This rattling can also damage the electrical components found on the circuit board.

It is desirable to provide an enclosure assembly that can protect the electrical components against deceleration forces, that is cost effective to implement and that can easily adapted to a variety of enclosure designs.

SUMMARY

This section provides a general summary of some aspects, features and advantages provided by or associated with the inventive concepts hereinafter disclosed in accordance with the present disclosure and is not intended to be a comprehensive summation and/or limit the interpretation and scope of protection afforded by the claims.

In an aspect, this disclosure provides an enclosure assembly for enclosing an electronic controller for use in a vehicle, the enclosure assembly comprising a housing having at least one cavity shaped to receive an electrical component of an electronic controller, and an over-molded part formed inside the cavity, the over-molded part being formed from an elastic material and lining at least a portion of the cavity.

In accordance with this aspect, the enclosure assembly of the present disclosure is configured such that the over-molded part can include a retention feature for securing the over-molded part within the cavity. The over-molded part can include a plurality of ribs separated by slots formed within the cavity. The over-molded part can have a thickness dimension selected to form an interference fit with the electrical component received in the cavity. The over-molded part may be formed from a rubber material, an elastomeric material, or a mixture thereof. The over-molded part may include at least one spring protrusion extending into the cavity.

In another aspect, the present disclosure provides a method of forming an enclosure assembly for enclosing an electronic controller for use in a vehicle, the method comprising the steps of a) providing a housing having at least one cavity formed therein that is shaped for receiving an electrical component, and b) molding within the at least one cavity an over-molded part, the over-molded part lining a portion of the cavity and being formed from an elastic material, the over-molded part being retained within the cavity.

In accordance with this particular aspect, the cavity may include an opening and the over-molded part may include a retention feature extending through the opening for retaining the over-molded part within the cavity. The method may further include the step of inserting the electronic controller into the cavity such that an electrical component on the electronic controller forms an interference fit with the over-molded part within the cavity. A gap may be provided between the electrical component and the over-molded part to allow for flexure of the over-molded part.

These and other aspects and areas of applicability will become apparent from the description provided herein. The description and specific examples in this summary are intended for purposes of illustration only and are not intended to limit the scope of the present disclosure. The drawings that accompany the detailed description are described below.

DRAWINGS

The drawings described herein are for illustrative purposes only of selected embodiments and not all possible or anticipated implementations thereof, and are not intended to limit the scope of the present disclosure.

It will be noted that throughout the appended drawings, like features are identified by like reference numerals.

DETAILED DESCRIPTION

Figure 1:
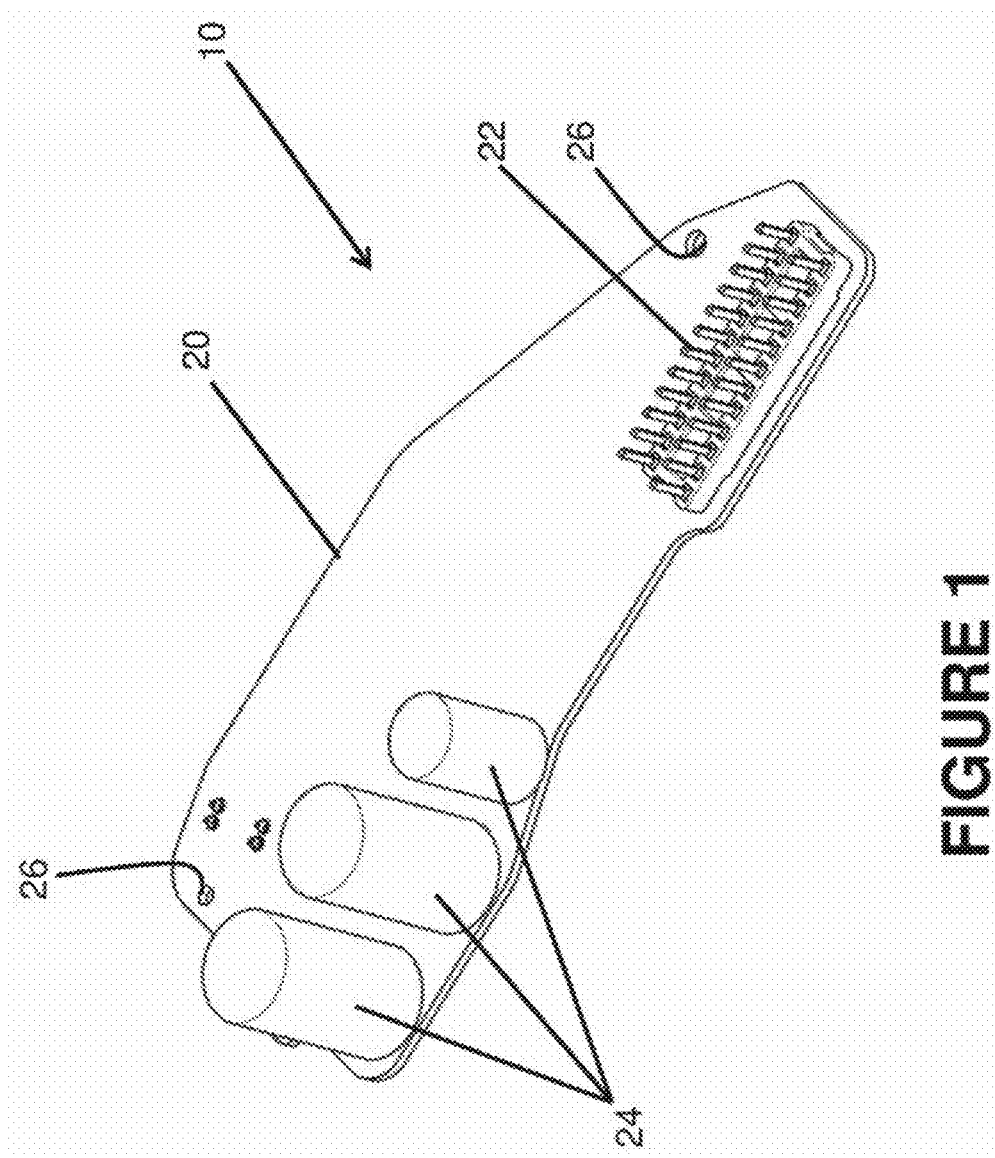
FIG. 1 shows a schematic representation of a stylized electronic controller comprising a circuit board having attached thereto a plurality of electrical components.

In the following description, details are set forth to provide an understanding of the present disclosure. In some instances, certain systems, structures and techniques have not been described or shown in detail in order not to obscure the disclosure.

In general, the present disclosure relates to an enclosure assembly for electronic controllers and electrical components, particularly those associated with latches. The enclosure assembly of this disclosure will be described in conjunction with one or more example embodiments. However, the specific example embodiments disclosed are merely provided to describe the inventive concepts, features, advantages and objectives will sufficient clarity to permit those skilled in this art to understand and practice the disclosure.

The enclosure assembly of the present disclosure includes features to protect the electrical components from damage due to deceleration forces which can damage the electrical components and their connections. These components might include, for example and without limitation, on-board backup batteries, capacitors, super capacitors, electronic controllers and other electrical components mounted onto a circuit board. The enclosure assembly can be adapted to enclose a variety of electronic controllers and their associated electrical components and circuit boards.

In the present disclosure the example that will be discussed is an electronic controller for a latch of a vehicle; however the design can be utilized with other electronic controllers and associate electrical components. An electronic controller (EC) for a latch is powered, during normal operating conditions, by the main power source of the vehicle. The EC also can have a built in a backup energy source to supply electrical power to the EC and the latch mechanisms during a failure operating condition. This could be a dead main battery, a crash or other main power source failure. The backup energy source often includes backup batteries, capacitors that are charged during normal operation and super capacitors that are charged during normal operations to store up electrical energy to be used during failure condition to operate the latch.

The disclosed enclosure assembly includes a rigid housing with an over-molded part having elastic properties that surrounds and retains an electrical component in a cavity formed in the housing and in position on a circuit board. The over-molded part is preferably formed from a rubber material, an elastomer, a mixture thereof, or another elastic material. It should be understood that the over-molded part can alternatively be formed of other materials, such as, but not limited to foam or plastic. The over-molded part needs to be able to deform and return to its original shape to dampen the effect of the deceleration on the electrical component it is protecting. The over-molded part fits inside the cavity in the housing where the electrical component is received. The over-molded part lines at least a portion of the cavity. The over-molded part also includes a retention feature that extends outside the housing and serves as a way to hold it in place inside the housing so it cannot be separated from the housing. The retention feature retains the over-molded part in position in the enclosure assembly during its manufacture, transportation and use to enclose the electronic controller.

In one aspect, the over-molded part may be formed to include a plurality of ribs around a circumference to allow for easy insertion of an electrical component into the cavity and to provide a radial interference fit of the electrical component in the cavity. Preferably, the over-molded part is designed to have a chamfered rim to ease the insertion process and to help with alignment of the electrical component in the cavity (i.e., the ribs are compressed or displaced as the electrical component is inserted into the cavity). In another preferred embodiment the over-molded part includes top ribs to further help with removing deceleration forces. These top ribs can be any design, for example a cross hatch design, a series of concentric circles or rims or other designs to provide a buffer against the top of the electrical component in the cavity. The thickness of the over-molded part inside the cavity is dictated by the overall size constraints of the cavity relative to the electrical component received in the cavity and the amount of expected deceleration force. The thickness of the over-molded part in the cavity is sufficient to provide an interference fit between the over-molded part and an electrical component received in the cavity.

As described above, the over-molded part can be formed from a rubber material, an elastomeric material, foam, plastic, or mixtures thereof. The chosen material must be elastic or resilient to provide a dampening effect and to hold the electrical component in place without suffering as strong of a deceleration effect. Suitable elastomeric, foam, plastic, and rubber materials are known to those of skill in the art.

The disclosed enclosure assembly is preferably formed by a molding process wherein the over-molded part is molded onto a portion of the housing of the enclosure assembly. Preferably, the over-molded part is formed by injection molding of the rubber or elastomer material over the desired portion of the housing to line a portion of a cavity in the housing that is intended to receive an electrical component. This process also allows the retention features to be developed by the shape of the mold so that the over-molded part does not come out of the housing. The retention features make the enclosure assembly easier to package and use on an assembly line. The enclosure assembly and the over-molded part stay together and in alignment by virtue of the retention feature. The design also allows one to remove the EC from an enclosure assembly without pulling out the over-molded part for repair or replacement of the EC. The over-molded part design can be accommodated to any housing shape and thus offers a universal solution.

FIG. 1 shows a schematic representation of a stylized electronic controller 10 comprising a printed circuit board 20 having attached thereto a plurality of electrical components 24. The stylized electronic controller shown at 10 is meant to be for illustration purposes only and not to limit the shape, functionality or design of any electronic controller (EC) that might be used with the present disclosure. The circuit board 20 is also shown as having an optional terminal block 22 mounted thereto. The circuit board 20 further comprises one or more holes 26 that can be used to locate the EC 10 within an enclosure assembly, discussed below, and/or to secure it to an enclosure assembly. The circuit board 20 may be any suitable type of circuit board, such as a printed circuit board and may have a plurality of electrical components 24 soldered thereto as shown. The circuit board 20 may be formed from any suitable material such as an epoxy resin reinforced with glass-fiber.

The electrical components 24 can have any shape or size and the shapes and sizes shown in FIG. 1 are for illustration purposes only. The electrical components 24 can comprise a variety of electrical components including, for example, a processor, a relay, a connector to a daughter board or a daughter board, a backup battery, a capacitor, a super capacitor, or a terminal block 22. The terminal block 22 permits the connection of the electronic controller 10 to other electrical components such as an external power source (e.g. the vehicle's low-voltage battery system) and for communication with other devices in the vehicle. The low-voltage battery system may refer to a 12V battery system, a 42V battery system or some other voltage. The term 'low-voltage' is intended to distinguish the battery system from the high-voltage battery system found on vehicles that have an electric traction motor. For greater certainty, it will be understood that the controller 10 may be used in vehicles that have electric traction motors and also vehicles that do not have such motors.

Figure 2:
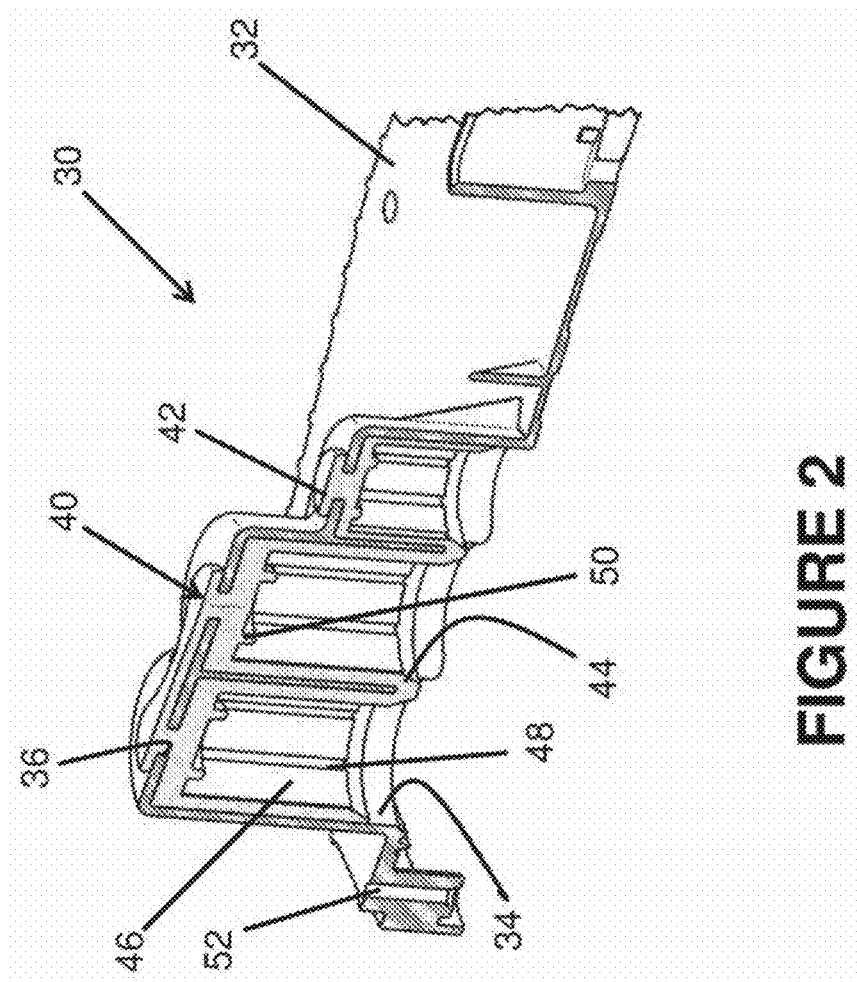
FIG. 2 is a side cutaway view of a portion of an electronic controller enclosure assembly constructed according to a first embodiment of the present disclosure and which is designed to accommodate the electronic controller shown in FIG. 1.

FIG. 2 shows a side cutaway view of a portion of a first embodiment of an electronic controller enclosure assembly 30 constructed according to the present disclosure and designed to accommodate the electronic controller 10 shown in FIG. 1. Only a portion of the enclosure assembly 30 is shown for illustrative purposes and simplicity. The enclosure assembly 30 includes a housing 32 having formed therein a series of cavities 34, each cavity 34 is shaped to receive an electrical component 24. Although the electrical components 24 are illustrated in the Figures as capacitors, it should be appreciated that cavities 34 and over-molded part 40 can accommodate various other electrical components 24, such as, but not limited to batteries. The enclosure assembly 30 typically includes two mating housings 32, only one of which is shown, that are designed to fit together to fully enclose the EC 10. The other portion of the enclosure assembly 30 is not shown for simplicity. The housing 32 can be formed from a variety of suitable materials as known to those of skill in the art including rigid plastic and resin materials. The housing 32 can include a plurality of holes 52 used to secure the two portions of the enclosure assembly 30 together and to secure the housing 32 to a vehicle. The housing 32 can be secured to any location of a vehicle; typically a housing 32 for a latch is secured inside a door panel as known to those of skill in the art. As shown, each cavity 34 includes at least one opening 36 in a top portion of the cavity 34.

Each cavity 34 includes an over-molded part 40 designed to surround and protect the electrical component 24 received in the cavity 34. The over-molded part 40 lines a portion of the cavity 34. The over-molded part 40 can be a unitary design as shown (i.e., for multiple cavities 34) or it can be created a separate part for each cavity 34. The over-molded part 40 is designed to include a retention feature 42 that extends through the at least one opening 36 to locate the over-molded part 40 in the cavity 34 and to secure the over-molded part 40 within the cavity 34. The retention feature 42 includes a swelled portion larger than the opening 36 on the outside of the cavity 34 that ensures that the over-molded part 40 does not get separated from the cavity 34 as the EC 10 is inserted into the enclosure 30 and removed therefrom. It also ensures that the over-molded part 40 stays with enclosure assembly 30 housing 32 during manufacture, transportation and assembly of the enclosure assembly 30. The retention feature 42 can have other shapes so long as it retains the over-molded part 40 in the cavity 34. Preferably the over-molded part 40 is designed with a rim having a chamfer 44 to make insertion of the EC 10 into the cavities 34 easier. In addition, the over-molded part 40 can comprise a series of ribs 46 separated by slots 48 to also ease insertion of the electrical components 24 into the cavities 34. In another optional feature the over-molded part 40 can include one or more top ribs 50 to further protect the electrical component 24 received in the cavity 34. The shape and number of ribs 46 and 50 can be adjusted according to the shape and design of the electrical component 24. The over-molded part 40 has a thickness sufficient to form an interference fit with the electrical component received in the cavity 34. In the design shown in FIG. 2 the ribs 46 and slots 48 serve to provide a radial interference fit with the electrical component 24 received in the cavity 34. This radial interference fit aids during assembly of the enclosure assembly 30 and to further protect the electrical components 24.

In addition to or as an alternative to ribs 46 and top ribs 50, crush ribs can be molded into the over-molded part 40 (e.g., extending inwardly from and along the length of cavity 34). Such crush ribs can be formed to have semicircular, rectangular, or triangular cross-sections, for example, to help maintain an interference fit with the electrical component 24, while providing desired damping characteristics.

Figure 3:
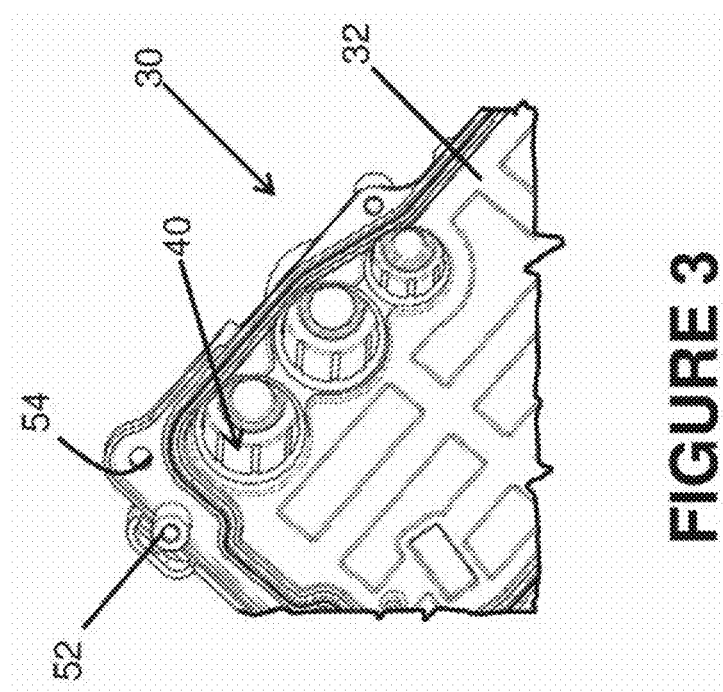
FIG. 3 is a bottom view of a portion of the enclosure assembly shown in FIG. 2.

FIG. 3 is a bottom view of a portion of the housing 32 shown in FIG. 2. As shown, the housing 32 of enclosure assembly 30 can include a series of holes 54 or a boss 52 with a through hole as shown. These can be used to secure the two portions of an enclosure assembly 30 together or to secure the enclosure assembly 30 to a vehicle. The enclosure assembly 30 can be mounted to any suitable location in the vehicle, such as inside a door panel or any other structure. As known to those of skill in the art, the enclosure assembly 30 could also comprise clips, not shown, to allow for securing the two portions of the enclosure assembly 30 together without the use of any tools.

Figure 4:
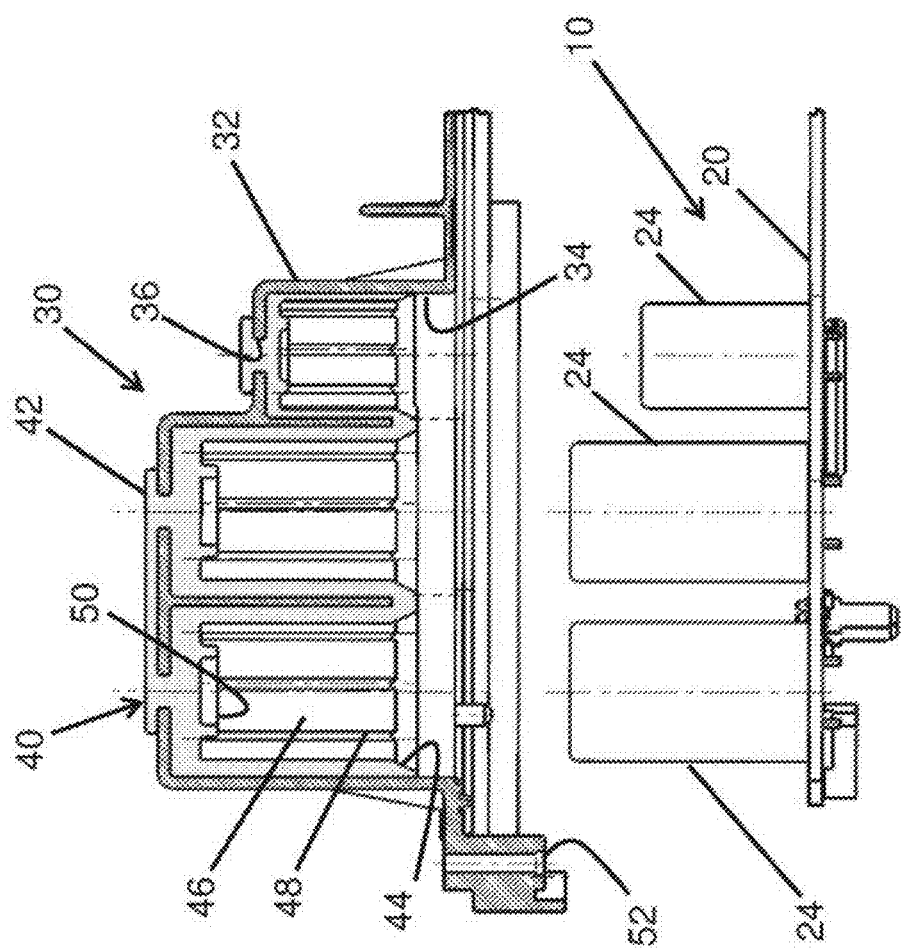
FIG. 4 shows a side cutaway view of a portion of the enclosure assembly shown in FIG. 2 aligned with the electronic controller shown in FIG. 1.
Figure 5:
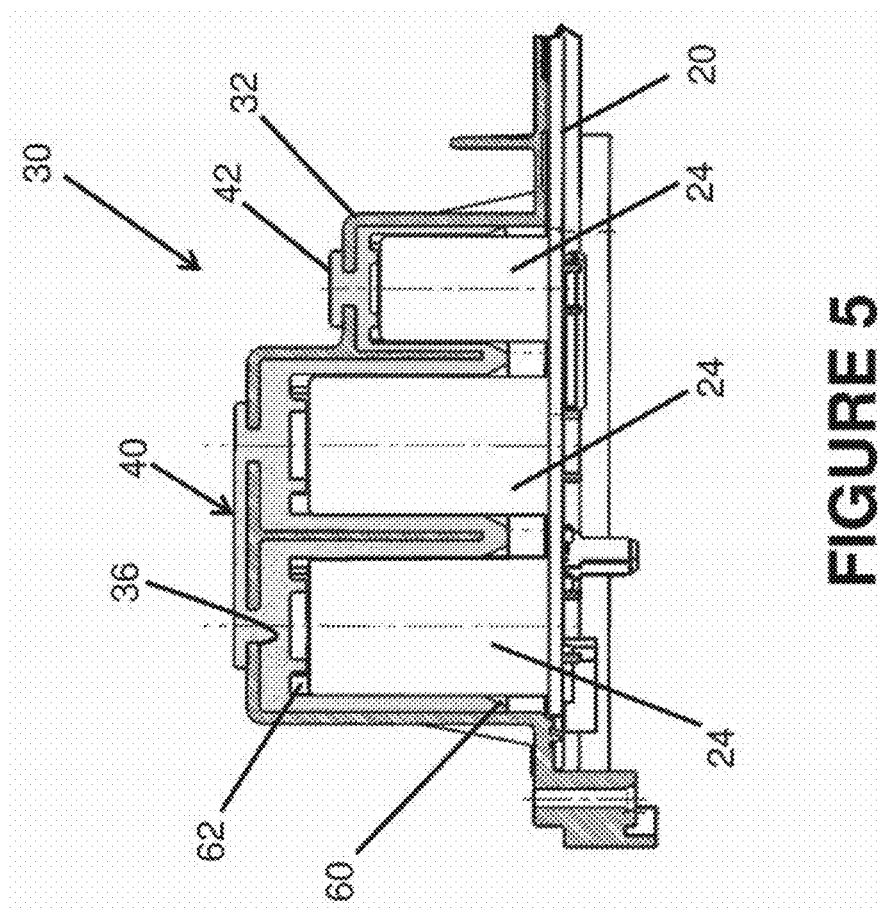
FIG. 5 shows the electronic controller shown in FIG. 4 fully inserted into the enclosure assembly shown in FIG. 4.

FIG. 4 shows a side cutaway view of a portion of the enclosure assembly 30 shown in FIG. 2 and aligned with the electronic controller 10 shown in FIG. 1 prior to insertion of the electronic controller 10 into the enclosure assembly 30. FIG. 5 shows the electronic controller 10 shown in FIG. 4 inserted fully into the enclosure assembly 30 shown in FIG. 4 according to the present disclosure. The electrical components 24 and EC 10 are secured in the enclosure assembly 30 by the interference fit with the over-molded part 40. In addition, as discussed herein the EC 10 may include holes 26 used to secure the EC 10 to the housing 32. In other designs, the EC 10 is held in place in the enclosure assembly 30 by virtue of the two portions of the enclosure assembly 30 being secured to each other. When inserted into the cavity 34 a series of gaps 60 and 62 are created to accommodate some flex of the over-molded part 40 in the cavities 34 during deceleration events and to allow for some deformation of the over-molded part 40. Similar gaps, not shown, are created by the slots 48. All of the gaps allow for flex of the over-molded part 40 to absorb the deceleration forces and prevent them from damaging the electrical components. The over-molded part 40 significantly reduces the effect of deceleration forces on the electrical components 24. The electrical components 24 are held in a secure manner and cushioned by the elastic nature of the material used to form the over-molded part 40. The electrical components 24 are not subject to damage from rattling either as they are held in an interference fit with some give as provided by the elastic nature of the over-molded part 40.

Figure 6:
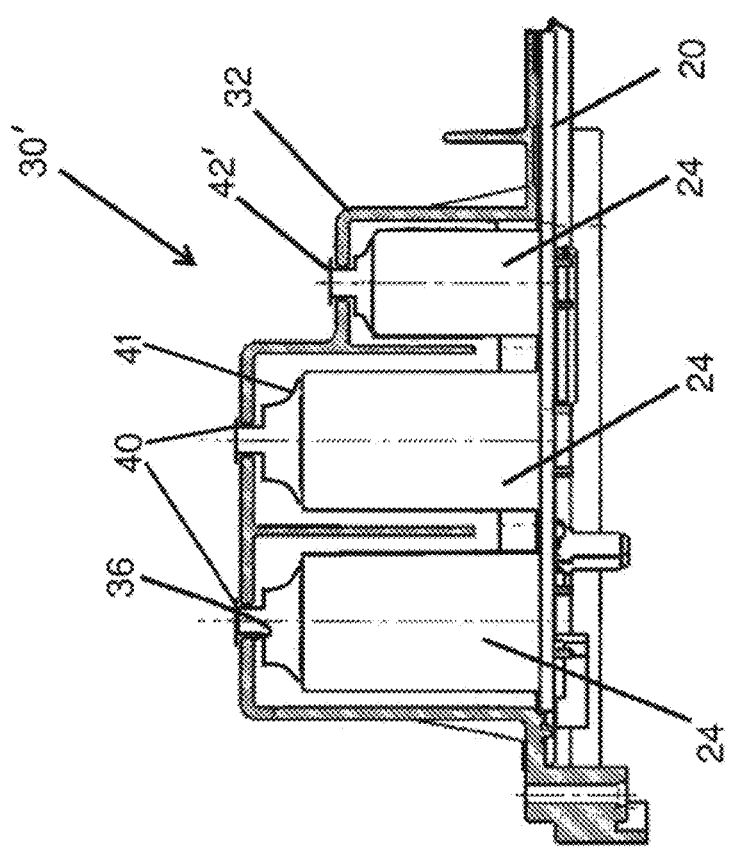
FIG. 6 shows the electronic controller shown in FIG. 4 fully inserted into an enclosure assembly constructed according to a second embodiment of the present disclosure.

FIG. 6 shows a side cutaway view of a portion of a second embodiment of an enclosure assembly 30' and shows the electronic controller 10 inserted fully into the enclosure assembly 30' according to the present disclosure. Like the first embodiment, the electrical components 24 and EC 10 are secured in the enclosure assembly 30' by the interference fit with the over-molded part 40'. However, the over-molded part 40' utilizes spring protrusions 41 that extend into the cavity 34 in order to provide an interference fit and to damp movement of the electronic components 24. Such an over-molded part 40' is preferably formed of a resilient or elastic plastic, however, other materials may be used instead. When in contact with the electronic components 24, the spring protrusions 41 accommodate some flex of the over-molded part 40' in the cavities 34 during deceleration events and to allow for some deformation of the over-molded part 40', much like the over-molded part 40 of the first embodiment. The over-molded part 40' includes a retention feature 42' that extends through the at least one opening 36 to locate the over-molded part 40' in the cavity 34 and to secure the over-molded part 40' within the cavity 34. The retention feature 42' includes a lip portion larger than the opening 36 on the outside of the cavity 34 that ensures that the over-molded part 40' does not get separated from the cavity 34 as the EC 10 is inserted into the enclosure 30' and removed therefrom. The retention feature 42' also ensures that the over-molded part 40' stays with the housing 32 of the enclosure assembly 30' during manufacture, transportation and assembly of the enclosure assembly 30'. The retention feature 42' can alternatively have other shapes to retain the over-molded part 40' in the cavity 34.

Figure 7:
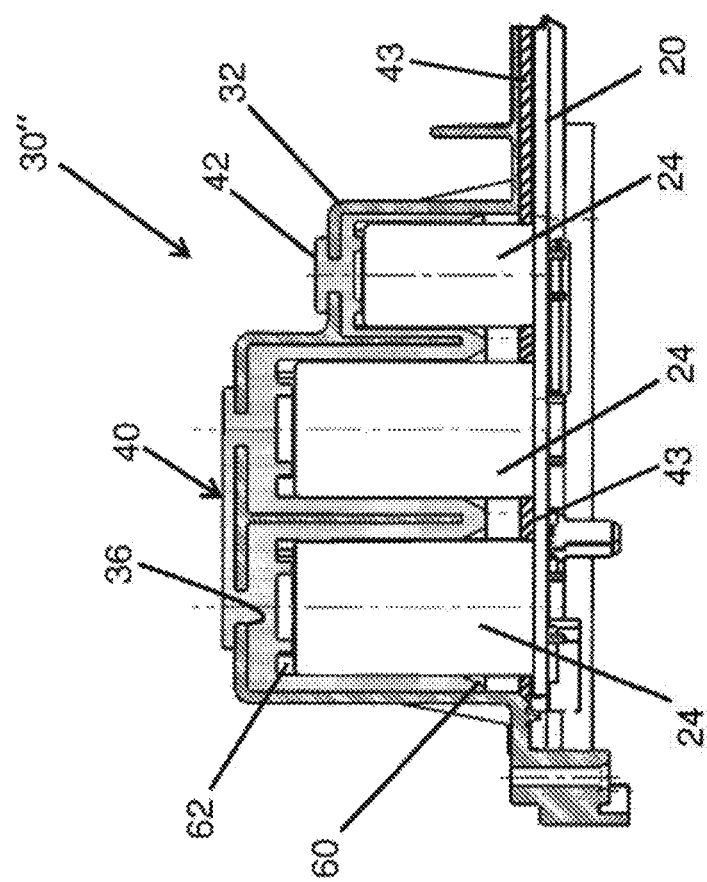
FIG. 7 shows the electronic controller shown in FIG. 4 fully inserted into an enclosure assembly constructed according to a third embodiment of the present disclosure.

FIG. 7 shows a side cutaway view of a portion of a third embodiment of an enclosure assembly 30" and shows the electronic controller 10 inserted fully into the enclosure assembly 30" according to the present disclosure. As in the first embodiment, the electrical components 24 and EC 10 are secured in the enclosure assembly 30" by the interference fit with the over-molded part 40. However, the enclosure assembly 30" also includes a separate dampening gasket 43 in addition to the over-molded part 40. The dampening gasket 43 is disposed between the circuit board 20 and the housing 32. It should be appreciated that the dampening gasket 43 could alternatively be disposed on the opposite side of the circuit board 20 for engaging the second portion of the enclosure assembly 30".

In summary, the disclosed enclosure assemblies 30, 30', 30" with over-molded parts 40, 40' provide an improved enclosure assemblies 30, 30', 30" that protect electrical components 24 of electrical controllers 10. The disclosed process and product can be rapidly adjusted to changes in enclosure design. It is a cost effective solution and reduces the effect of deceleration on electrical components 24. It also prevents rattling of the electronic controllers 10 in the enclosure assemblies 30, 30', 30".

Figure 8:
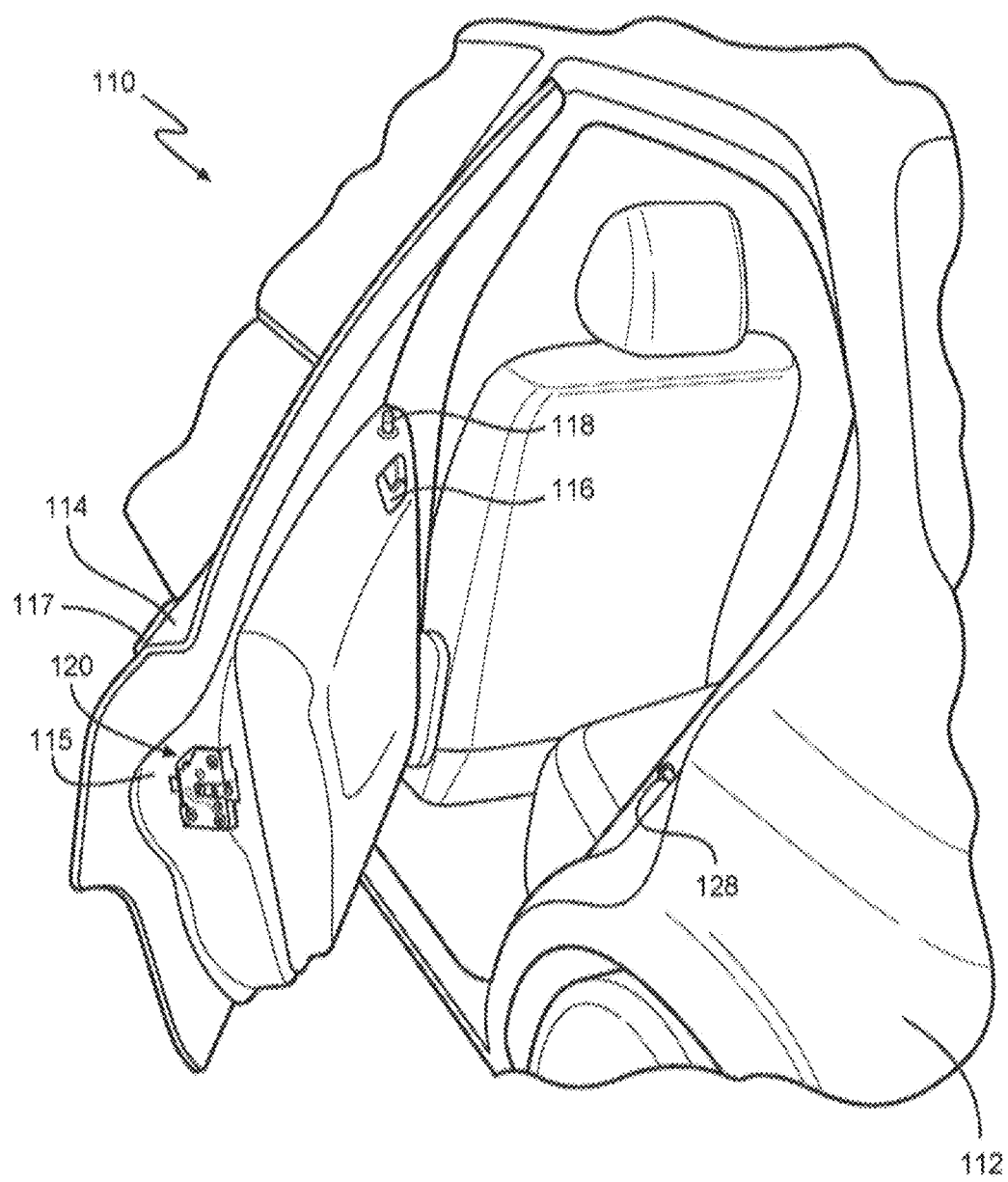
FIG. 8 is a perspective view of a closure panel system of a motor vehicle having a power latch assembly equipped with the enclosure assembly of the present disclosure.

FIG. 8 is a perspective view of a vehicle 110 that includes a vehicle body 112 and at least one vehicle door 114 (also referred to as closure panel 114). The vehicle door 114 includes a latch assembly 120 that is positioned on an edge face 115 and which is releasably engageable with a striker 128 on the vehicle body 112 to releasably hold the vehicle door 114 in a closed position. An outside door handle 117 and an inside door handle 116 are provided for opening the latch assembly 120 (i.e. for releasing the latch assembly 120 from the striker 128) to open the vehicle door 114. An optional lock knob 118 is shown and provides a visual indication of the lock state of the latch assembly 120 and may be operable to change the lock state between an unlocked position and a locked position.

The closure panel 114 (e.g. occupant ingress or egress controlling panels such as but not limited to vehicle doors and lift gates/hatches) is connected to the vehicle body 112 via one or more hinges (not shown) and the latch assembly 120 (e.g. for retaining the closure panel 114 in a closed position once closed). It is also recognized that the hinge can be configured as a biased hinge that can be configured to bias the closure panel 114 towards the open position and/or towards the closed position. As shown in FIG. 8, the latch assembly 120 can be mounted on the closure panel 114 and the mating latch component 128 can be mounted on the body 112. Alternative to that shown in FIG. 8, the closure panel 114 can have a mating latch component 128 (e.g. striker) mounted thereon for coupling with a respective latch assembly 120 (e.g. with a ratchet component of the latch assembly 120) mounted on the vehicle body 112 (not shown). It is contemplated that enclosure assemblies 30, 30', 30" with over-molded parts 40, 40" disclosed in reference to FIGS. 1-7, will be associated with latch assembly 120 to provide the improvement described previously in great detail.

The foregoing invention has been described in accordance with the relevant legal standards, thus the description is exemplary rather than limiting in nature. Variations and modifications to the disclosed embodiment may become apparent to those skilled in the art and do come within the scope of the invention. Such variations are not to be regarded as a departure from the disclosure, and all such modifications are intended to be included within the scope of the disclosure. Those skilled in the art will recognize that concepts disclosed in association with an example enclosure assembly can likewise be implemented into many other systems to control one or more operations and/or functions. Accordingly, the scope of legal protection afforded this invention can only be determined by studying the following claims.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

What is claimed is:

1. A closure latch assembly for a vehicle, the closure latch assembly comprising:
   an electrically operable latch assembly;
   an enclosure assembly associated with the electrically operable latch assembly;
   a housing of the enclosure assembly configured to retain an electrical component therein;
   an electronic controller disposed within the housing, the electronic controller including at least one electrical component;
   an over-molded part molded onto the housing and disposed inside said housing between the at least one electrical component and the housing, said over-molded part formed from an elastic material and shaped to retain said at least one electrical component.

2. The closure latch assembly of claim 1, wherein the housing includes at least one cavity formed therein, the cavity shaped to receive the at least one electrical component, wherein the over-molded part is disposed within the at least one cavity and lining at least a portion of the cavity.

3. The closure latch assembly of claim 2, wherein said over-molded part further comprises a retention feature, said retention feature securing said over-molded part within said cavity, and said cavity includes at least one opening in a top portion thereof and said over-molded part extends through said at least one opening in said cavity thereby forming said retention feature.

4. The closure latch assembly of claim 2, wherein said at least one cavity of said housing includes a plurality of cavities and said over-molded part is formed inside each of said plurality of cavities.

5. The closure latch assembly of claim 4, wherein said over-molded part is of unitary design.

6. The closure latch assembly of claim 1, wherein the at least one electrical component is a printed circuit board.

7. The closure latch assembly of claim 1, wherein the electronic controller includes a printed circuit board disposed within the housing, and at least one electrical component is attached to the printed circuit board.

8. The closure latch assembly of claim 7, wherein the at least one electrical component projects outwardly from the printed circuit board.

9. The closure latch assembly of claim 8, wherein the at least one electrical component defines a central axis, wherein the central axis is generally perpendicular to the printed circuit board.

10. The closure latch assembly of claim 9, wherein the at least one electrical component is a super-capacitor.

11. An electronic latch assembly comprising:
- an electronic controller including at least one electrical component configured to operate the electronic latch assembly;
- a housing having at least one cavity formed therein, the cavity shaped to receive at least a portion of the electronic controller;
- an over-molded part disposed within the at least one cavity, said over-molded part formed from an elastic material and disposed between at least a portion of the electronic controller and the housing.

12. The electronic latch assembly of claim 11, wherein the electronic controller includes a printed circuit board.

13. The electronic latch assembly of claim 12, wherein the at least one electrical component is attached to the printed circuit board and projects outwardly from the printed circuit board.

14. The electronic latch assembly of claim 13, wherein the at least one cavity and the at least one electrical component extend in the same direction.

15. The electronic latch assembly of claim 13, wherein the at least one electrical component defines a central axis that extends generally perpendicular to the printed circuit board.

16. The electronic latch assembly of claim 15, wherein the at least one electrical component is a super-capacitor.

17. The electronic latch assembly of claim 11, wherein the at least one electrical component is a printed circuit board.

18. The electronic latch assembly of claim 11, wherein the over-molded part includes a retention feature and the housing includes at least one opening in a top portion thereof, and the retention feature extends through the at least one opening and secures the over-molded part.

19. The electronic latch assembly of claim 11, wherein said at least one cavity of said housing includes a plurality of cavities and said over-molded part is formed inside each of said plurality of cavities, said over-molded part being of unitary design.

20. A method of assembling an electronic latch assembly, the method comprising:
- providing a housing of the electronic latch assembly, the housing having at least one cavity formed therein;
- over-molding an over-molded part onto the housing and within the at least one cavity, wherein the over-molded part is formed from an elastic material;
- disposing an electronic controller having at least one electrical component within the housing, wherein at least a portion of the electrical component is disposed within the cavity, wherein the over-molded part is disposed within the cavity between at least a portion of the at least one electrical component and the housing.

* * * * *